(12) United States Patent
Liu

(10) Patent No.: US 9,312,324 B2
(45) Date of Patent: Apr. 12, 2016

(54) ORGANIC THIN FILM TRANSISTOR COMPRISING BANKS, ORGANIC THIN FILM TRANSISTOR ARRAY SUBSTRATE AND DISPLAY DEVICE

(71) Applicant: BOE TECHNOLOGY GROUP CO., LTD., Beijing (CN)

(72) Inventor: Ze Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 76 days.

(21) Appl. No.: 13/806,215

(22) PCT Filed: Nov. 8, 2012

(86) PCT No.: PCT/CN2012/084336
§ 371 (c)(1),
(2) Date: Dec. 21, 2012

(87) PCT Pub. No.: WO2013/075587
PCT Pub. Date: May 30, 2013

(65) Prior Publication Data
US 2014/0084265 A1    Mar. 27, 2014

(30) Foreign Application Priority Data
Nov. 23, 2011    (CN) .................. 2011 2 0471301 U

(51) Int. Cl.
*H01L 29/08*    (2006.01)
*H01L 51/00*    (2006.01)
(Continued)

(52) U.S. Cl.
CPC .......... *H01L 27/3276* (2013.01); *H01L 27/283* (2013.01); *H01L 27/3246* (2013.01);
(Continued)

(58) Field of Classification Search
CPC ................... H01L 29/41733; H01L 29/66757; H01L 51/0541
USPC ................ 257/40, 57, 59, 66, 72, E29.295, 257/E29.273, E29.29
See application file for complete search history.

(56) References Cited

U.S. PATENT DOCUMENTS 6,410,411 B1 * 6/2002 McGarvey et al. ........... 438/592
6,870,182 B2 * 3/2005 Koyama ................ H01L 51/057
                                                    257/330
(Continued)

FOREIGN PATENT DOCUMENTS

CN    101645462 A    2/2010
CN    101645488 A    2/2010
(Continued)

OTHER PUBLICATIONS

International Search Report mailed Feb. 14, 2013; PCT/CN2012/084336.
(Continued)

*Primary Examiner* — Jesse Y Miyoshi
(74) *Attorney, Agent, or Firm* — Ladas & Parry LLP

(57) ABSTRACT

Embodiments of the invention provide an organic thin film transistor, an organic thin film transistor array substrate and a display device. The organic thin film transistor comprises a transparent substrate; source and drain electrodes formed on the transparent substrate; an active layer formed on the transparent substrate by an organic semiconductor material and disposed between the source and drain electrodes; a gate insulating layer formed on the active layer; a gate electrode formed on the gate insulating layer; and first and second banks disposed on the transparent substrate, inner sides of the first and second banks being covered by the source and drain electrodes, respectively.

20 Claims, 1 Drawing Sheet

(51) Int. Cl.
  *H01L 27/32* (2006.01)
  *H01L 29/417* (2006.01)
  *H01L 29/66* (2006.01)
  *H01L 27/28* (2006.01)
  *H01L 51/05* (2006.01)
  *H01L 51/10* (2006.01)

(52) U.S. Cl.
  CPC ...... *H01L27/3274* (2013.01); *H01L 29/41733* (2013.01); *H01L 29/66757* (2013.01); *H01L 51/0541* (2013.01); *H01L 51/0558* (2013.01); *H01L 51/105* (2013.01); *H01L 51/0545* (2013.01); *H01L 51/102* (2013.01)

(56) References Cited

U.S. PATENT DOCUMENTS

| | | | |
|---|---|---|---|
| 7,445,971 B2 * | 11/2008 | Saito et al. | 438/149 |
| 7,517,739 B2 * | 4/2009 | Pei et al. | 438/149 |
| 8,530,944 B2 * | 9/2013 | Yamazaki | 257/288 |
| 2006/0108581 A1 * | 5/2006 | Ahn et al. | 257/40 |
| 2009/0072226 A1 * | 3/2009 | Koo et al. | 257/40 |
| 2010/0032660 A1 | 2/2010 | Nomoto et al. | |
| 2010/0032665 A1 | 2/2010 | Yamazaki et al. | |
| 2010/0051922 A1 | 3/2010 | Hotta et al. | |

FOREIGN PATENT DOCUMENTS

| | | |
|---|---|---|
| CN | 101983439 A | 3/2011 |
| CN | 202332973 U | 7/2012 |
| JP | 2005-142474 A | 6/2005 |
| JP | 2009-076792 A | 4/2009 |

OTHER PUBLICATIONS

International Preliminary Report on Patentability Issued May 27, 2014 Appln. No. PCT/CN2012/084336.

* cited by examiner

ORGANIC THIN FILM TRANSISTOR COMPRISING BANKS, ORGANIC THIN FILM TRANSISTOR ARRAY SUBSTRATE AND DISPLAY DEVICE

TECHNICAL FIELD

Embodiments of the invention relate to an organic thin film transistor, an organic thin film transistor array substrate and a display device.

BACKGROUND

An organic thin film transistor (OTFT) has advantages of simple manufacturing process, low cost and good flexibility and so on, and thus it is widely used in a panel display field. Therefore, researches and developments for the organic thin film transistor (OTFT) array substrate has been drawn attention widely. Several patterning processes are generally required during a process for manufacturing the OTFT array substrate to form a patterned layered structure. A typical OTFT has such a structure that gate electrodes and an active layer formed of organic semiconductor material are formed on a substrate with a gate insulating film interposed therebetween, source and drain electrodes spaced from each other contact the active layer and correspond to two sides of the gate electrode and are insulated from the gate electrodes. The organic semiconductor material generally has low chemical stability and optical stability, and thus it is very difficult and complicated to pattern the organic semiconductor material. An ink jet printing process is now developed to form an active layer of the OTFT. The ink jet printing process is a process of printing ink droplets (i.e. a solution formed by solving a material to be used to form a pattern into a certain solvent) in a region to be formed with a desired pattern so as to form the desired pattern.

During a process for manufacturing an OTFT or an OTFT array substrate, when an active layer of the OTFT is formed by the ink jet printing process, patterns of the active layer may not exactly meet process requirements, that is, the patterns of the active layer have not sufficient accuracy, due to fluidity of the ink droplets, so that the property of the OTFT may be influenced and thus the property of the OTFT array substrate may be influenced.

SUMMARY

An embodiment of the invention provides an organic thin film transistor comprising: a transparent substrate; source and drain electrodes formed on the transparent substrate; an active layer formed on the transparent substrate by an organic semiconductor material and disposed between the source and drain electrodes; a gate insulating layer formed on the active layer; a gate electrode formed on the gate insulating layer; and first and second banks disposed on the transparent substrate, inner sides of the first and second banks being covered by the source and drain electrodes, respectively.

Another embodiment of the invention provides an organic thin film transistor array substrate comprising a transparent substrate and organic thin film transistors formed on the transparent substrate, the organic thin film transistor comprising source and drain electrodes formed on the transparent substrate; an active layer formed on the transparent substrate by an organic semiconductor material and disposed between the source and drain electrodes; a gate insulating layer formed on the active layer; a gate electrode formed on the gate insulating layer; and first and second banks disposed on the transparent substrate, inner sides of the first and second banks being covered by the source and drain electrodes, respectively.

Another embodiment of the invention provides a display device comprising an organic thin film transistor array substrate which comprises a transparent substrate and organic thin film transistors formed on the transparent substrate, the organic thin film transistor comprising: source and drain electrodes formed on the transparent substrate; an active layer formed on the transparent substrate by an organic semiconductor material and disposed between the source and drain electrodes; a gate insulating layer formed on the active layer; a gate electrode formed on the gate insulating layer; and first and second banks disposed on the transparent substrate, inner sides of the first and second banks being covered by the source and drain electrodes, respectively.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION OF EMBODIMENTS

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

An embodiment of the invention provides an organic thin film transistor with improved characteristics, simplified manufacturing process and reduced manufacturing cost. An embodiment of the invention also provides an organic thin film transistor array substrate and a display device comprising the above organic thin film transistor._

The organic thin film transistor provided by an embodiment of the invention will be explained hereinafter with reference to FIG. 1.

Figure 1:
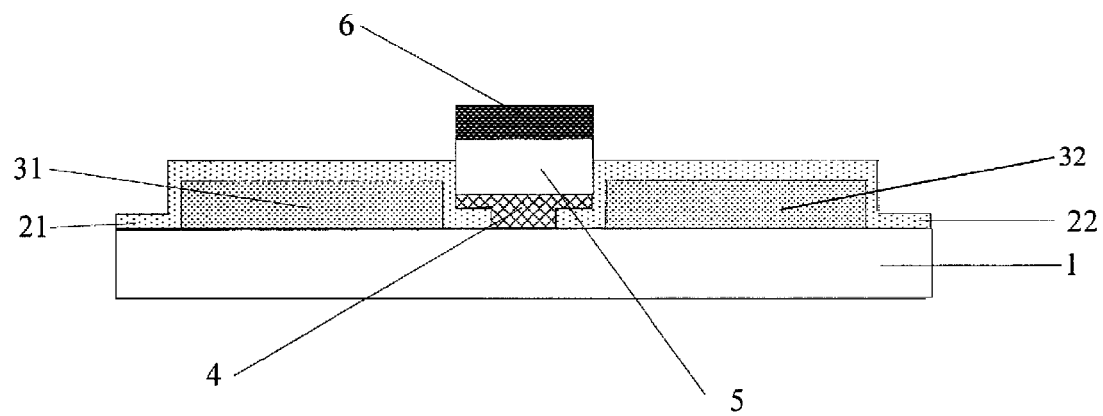
FIG. 1 is a schematic sectional view of a structure of an organic thin film transistor (OTFT) provided by an embodiment of the invention.

As shown in FIG. 1, an organic thin film transistor provided by an embodiment of the invention comprises, for example, a transparent substrate 1, source and drain electrodes 21 and 22 formed on the transparent substrate 1, an active layer 4 formed on the transparent substrate 1 by an organic semiconductor material and disposed between the source and drain electrodes 21 and 22, a gate insulating layer 5 formed on the active layer 4, a gate electrode 6 formed on the gate insulating layer 5, and first and second banks 31 and 32 disposed on the transparent substrate 1 with the source and drain electrode 21 and 22 covering the inner sides of the first and second banks 31 and 32, respectively.

In an embodiment of the invention, the transparent substrate 1 may be a glass substrate, a plastic substrate or the like.

In an embodiment of the invention, the first and second banks 31 and 32 may be formed of an organic material (for example, a light-curable resin or a thermal-curable resin) or an inorganic material.

In an embodiment of the invention, sides of the first and second banks 31 and 32 facing the active layer 4 are called as an inner side of first bank 31 and an inner side of the second bank 32, respectively.

It should be noted that, in an embodiment of the invention, only the inner sides of the first and second banks are needed to be covered by the source and drain electrodes of the organic thin film transistor, and the other portions of the first and second banks may be covered by the source and drain electrodes or not.

In this embodiment, as shown in FIG. 1, the source and drain electrodes 21 and 22 of the organic thin film transistor cover the inner sides of the first and second banks 31 and 32, respectively, and also cover the upper surfaces of the first and second banks 31 and 32, respectively, that is, the source and drain electrodes 21 and 22 of the organic thin film transistor completely cover the first and second banks 31 and 32, respectively.

In this embodiment, the first and second banks 31 and 32 may be disposed in the same layer, but in the other embodiments of the invention, the first and second banks 31 and 32 may be disposed in different layers. In embodiments of the invention, "the same layer" means one layer of film formed of the same material, and "being disposed in the same layer" involves at least two patterns, that is, means a structure having at least two patterns formed of the same layer of film, for example, at least two patterns formed of the same layer of film made of the same material by a patterning process. In this embodiment, "the first and second banks disposed in the same layer" means that the first and second banks are two patterns formed of the same layer of film made of the same material. It should be noted that the first and second banks in this embodiment are two patterns which have the same shape and are disposed at different positions. In this embodiment, for example, heights of the first and second banks 31 and 32 are about 1 to 5 micrometers, but in the other embodiments of the invention, the first and second banks 31 and 32 may have the other different heights.

In this embodiment, as shown in FIG. 1, the gate electrode 6 and the gate insulating layer 5 have shapes consistent with each other. In this embodiments, "shapes consistent with each other" means that shapes and sizes in top view of the gate electrode 6 and the gate insulating layer 5 are identical completely, and thus the gate electrode 6 and the gate insulating layer 5 having shapes consistent with each other can be formed using the same mask plate, which facilitates to reduce the producing cost. In the other embodiments of the invention, the gate insulating layer 5 and the gate electrode 6 may also have shapes inconsistent with each other, for example, as that in the conventional thin film transistor, the gate insulating layer completely covers the whole transparent substrate.

In the organic thin film transistor provided by embodiments of the invention, the source and drain electrodes are raised by the banks, respectively, to define a region for forming the active layer, so that an active layer can be formed by an ink jet printing process in the defined region, and thus a pattern of the active layer may be exactly controlled and the active layer may contact the source and drain electrodes in a larger area so as to improve characteristics of the OTFT. Moreover, in the prior art, not only the organic material of the banks but also metal, metal oxides or the like of the source and drain electrodes contact the active layer, and thus different processing methods and complicated processes are needed in order to form the active layer uniformly, whereas in the embodiments of the invention, only the metal or metal oxides or the like of the source and drain electrodes contact the active layer, and thus the process may be simplified upon forming the active layer by an ink jet printing process.

A method for manufacturing an organic thin film transistor provided by embodiments of the invention will be explained hereinafter, which may be used to manufacture the organic thin film transistor shown in FIG. 1.

The method for manufacturing the thin film transistor (refer to FIG. 1) provided by an embodiment of the invention comprises for example the following steps.

S1, forming first and second banks on a transparent substrate by a printing method using an organic material such as resin, wherein the resin may be shaped by light curing or thermal curing. In the other embodiments of the invention, the first and second banks may also be formed by e.g. sputtering or chemical vapor deposition in combination with a photolithographic process using an inorganic material in the step S1.

S2, forming source and drain electrodes by depositing electrode materials such as metal, metal oxide or the like on the first and second banks and by performing a photolithographic (comprising exposure, development and so on) process and an etching process.

S3, forming an active layer by printing the organic semiconductor material on the regions defined by the source and drain electrodes by means of an ink jet printing process.

S4, forming a gate insulating layer by spin-coating or depositing a gate insulating material on the active layer.

S5, forming a gate electrode and a gate insulating layer by depositing an electrode material such as metal, metal oxide or the like on the gate insulating layer and then performing a masking process using the same mask plate. In the other embodiments of the invention, the gate electrode and the gate insulating layer may be formed by masking separately as the conventional thin film transistor, and the so formed gate insulating layer and the gate electrode have shapes inconsistent with each other and the gate insulating layer may completely cover the whole transparent substrate.

By means of the above method, the organic thin film transistor as shown in FIG. 1 according to the embodiments of the invention may be manufactured.

An OTFT array substrate provided by an embodiment of the invention will be explained hereinafter with reference to FIG. 2. The OTFT array substrate provided by embodiments of the invention may comprise a plurality of gate lines and data lines crossing with each other to define a plurality of pixel units arranged in an array, and a structure of only one pixel unit on the OTFT array substrate is shown in FIG. 2.

Figure 2:
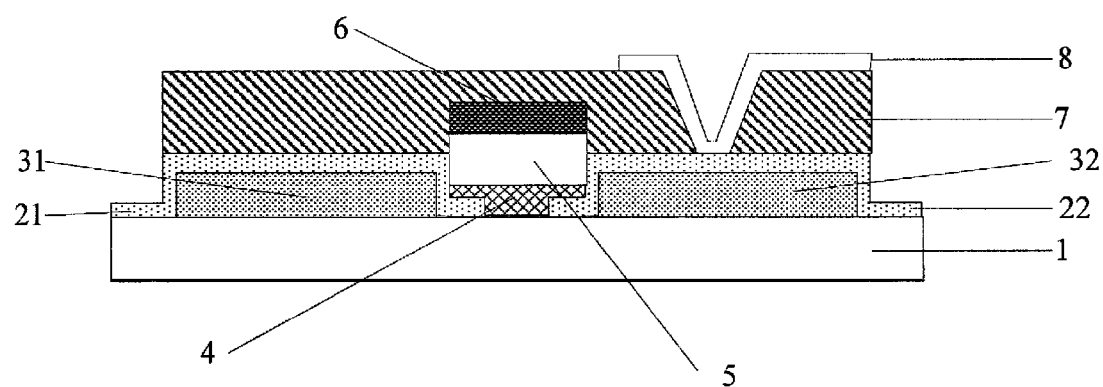
FIG. 2 is a schematic sectional view of a structure of an OTFT array substrate provided by an embodiment of the invention.

As shown in FIG. 2, an OTFT array substrate provided by an embodiment of the invention comprises for example a transparent substrate 1 and organic thin film transistors formed on the transparent substrate 1, wherein the organic thin film transistor comprises source and drain electrodes 21 and 22 formed on the transparent substrate 1, an active layer 4 formed on the transparent substrate 1 by an organic semiconductor material and disposed between the source and drain electrodes 21 and 22, a gate insulating layer 5 formed on the active layer 4, a gate electrode 6 formed on the gate insulating layer 5, and first and second banks 31 and 32 disposed on the transparent substrate 1 with the source and drain electrodes 21 and 22 covering inner sides of the first and second banks 31 and 32, respectively. In an embodiment of the invention, the OTFT array substrate described above also comprises a passivation layer 7 covering the organic thin film transistor with a via hole formed therein, and a pixel electrode 8 electrically connected to the drain electrode 22 of the organic thin film transistor through the via hole of the passivation layer 7.

In an embodiment of the invention, the transparent substrate 1 may be a glass substrate, a plastic substrate or the like.

In an embodiment of the invention, the first and second banks 31 and 32 may be formed of an organic material (for example, a light-curable resin or a thermal-curable resin) or an inorganic material.

In an embodiment of the invention, a side of the first bank 31 and a side of the second bank 32 facing the active layer 4 are called an inner side of the first bank 31 and an inner side of the second bank 32, respectively.

It should be noted that, in an embodiment of the invention, only the inner sides of the first and second banks are needed to be covered by the source and drain electrodes of the organic thin film transistor, and the other portions of the first and second banks may be covered by the source and drain electrodes or not.

In this embodiment, as shown in FIG. 2, the source and drain electrodes 22 and 22 of the organic thin film transistor cover the inner sides of the first and second banks 32 and 32, respectively, and also cover the upper surfaces of the first and second banks 32 and 32, respectively, that is, the source and drain electrodes 22 and 22 of the organic thin film transistor completely cover the first and second banks 32 and 32, respectively.

In this embodiment, the first and second banks 31 and 32 may be disposed in the same layer, but in the other embodiments of the invention, the first and second banks 31 and 32 may be disposed in different layers. In embodiments of the invention, "the same layer" means one layer of film formed of the same material, and "being disposed in the same layer" involves at least two patterns, that is, means a structure having at least two patterns formed of the same layer of film, for example, at least two patterns formed of the same layer of film made of the same material by a patterning process. In this embodiment, "the first and second banks disposed in the same layer" means that the first and second banks are two patterns formed of the same layer of film made of the same material. It should be noted that the first and second banks in this embodiment are two patterns which have the same shape and are disposed at different positions. In this embodiment, for example, heights of the first and second banks 31 and 32 are about 1 to 5 micrometers, but in the other embodiments of the invention, the first and second banks 31 and 32 may have the other different heights.

In this embodiment, as shown in FIG. 2, the gate electrode 6 and the gate insulating layer 5 have shapes consistent with each other. Thus the gate electrode 6 and a gate insulating layer 5 having shapes consistent with each other may be formed by using the same mask plate, which facilitates to reduce the producing cost and simplify processes. In the other embodiments of the invention, the gate electrode 6 and the gate insulating layer 5 may have shapes inconsistent with each other.

In the OTFT array substrate provided by embodiments of the invention, the source and drain electrodes are raised by the banks, respectively, to define a region for forming the active layer, so that an active layer can be formed by an ink jet printing process in the defined region, and thus patterns of the active layer may be exactly controlled and the active layer may contact the source and drain electrodes in a larger area so as to improve characteristics of the OTFT array substrate greatly. Moreover, in the prior art, not only the organic material of the banks but also metal, metal oxides or the like of the source and drain electrodes contact the active layer, and thus different processing methods and complicated processes are needed in order to form the active layer uniformly, whereas in the embodiments of the invention, only the metal or metal oxides or the like of the source and drain electrodes contact the active layer, and thus the process may be simplified upon forming the active layer by an ink jet printing process.

A method for manufacturing an OTFT array substrate provided by an embodiment of the invention will be explained hereafter, which may be used to manufacturing the OTFT array substrate shown in FIG. 2.

The method for manufacturing the OTFT array substrate shown in FIG. 2 may be combined with the method for manufacturing the organic thin film transistor shown in FIG. 1 (comprising steps S1 to S5), and the completing of the organic thin film transistor may be followed by the following steps, in order to manufacture the OTFT array substrate.

S6, forming a passivation layer by depositing a material used to form the passivation layer on the transparent substrate formed with the organic thin film transistor described above by using a plasma chemical vapor deposition process and then performing a patterning process, wherein the passivation layer is formed with a via hole to connect the pixel electrode and the drain electrode of the organic thin film transistor.

S7, forming a pixel electrode by depositing a material used to form the pixel electrode such as Indium Tin oxide (ITO), Indium Zinc oxide (IZO) or the other transparent conductive material on the passivation layer and then performing a patterning process, wherein the pixel electrode is electrically connected to the drain electrode of the organic thin film transistor through the via hole of the passivation layer.

An embodiment of the invention also provides a display device comprising the OTFT array substrate described above, and the display device may comprise any one of the OTFT array substrates described above. The display device provided by embodiments of the invention may comprise a liquid crystal panel, an organic light-emitting diode (OLED) panel, an electrophoresis display panel, a mobile phone, a monitor, a tablet computer or the like.

What are described above is related to the illustrative embodiments of the disclosure only and not limitative to the scope of the disclosure; the scopes of the disclosure are defined by the accompanying claims.

The invention claimed is:

1. An organic thin film transistor comprising:
a transparent substrate;
source and drain electrodes formed on the transparent substrate;
an active layer formed on the transparent substrate by an organic semiconductor material and disposed between the source and drain electrodes;

a gate insulating layer formed on the active layer;

a gate electrode formed on the gate insulating layer;

first and second banks disposed on the transparent substrate, inner sides of the first and second banks being covered by the source and drain electrodes, respectively, and wherein the active layer is in contact with the transparent substrate, and wherein the first and second banks are formed of a dielectric material, and none of the active layer, the gate insulating layer, and the gate electrode overlaps the first and second banks.

2. The organic thin film transistor of claim 1, wherein the source and drain electrodes completely cover the first and second banks, respectively.

3. The organic thin film transistor of claim 1, wherein the first and second banks are formed of light-curable resin or thermal-curable resin.

4. The organic thin film transistor of claim 1, wherein the gate electrode and the gate insulating layer have shapes consistent with each other.

5. The organic thin film transistor of claim 1, wherein the first and second banks are disposed in the same layer.

6. The organic thin film transistor of claim 5, wherein heights of the first and second banks range from 1 to 5 micrometers.

7. An organic thin film transistor array substrate comprising a transparent substrate and organic thin film transistors formed on the transparent substrate, the organic thin film transistor comprising:

source and drain electrodes formed on the transparent substrate;

an active layer formed on the transparent substrate by an organic semiconductor material and disposed between the source and drain electrodes;

a gate insulating layer formed on the active layer;

a gate electrode formed on the gate insulating layer;

first and second banks disposed on the transparent substrate, inner sides of the first and second banks being covered by the source and drain electrodes, respectively, and wherein the active layer is in contact with the transparent substrate, and wherein the first and second banks are formed of a dielectric material, and none of the active layer, the gate insulating layer, and the gate electrode overlaps the first and second banks.

8. The organic thin film transistor array substrate of claim 7, wherein the source and drain electrodes completely cover the first and second banks, respectively.

9. The organic thin film transistor array substrate of claim 7, further comprising:

a passivation layer covering the organic thin film transistor with a via hole formed therein; and a pixel electrode electrically connected to the drain electrode through the via hole.

10. The organic thin film transistor array substrate of claim 7, wherein the first and second banks are formed of a light-curable resin or a thermal-curable resin.

11. The organic thin film transistor array substrate of claim 7, wherein the gate electrode and the gate insulating layer have shapes consistent with each other.

12. The organic thin film transistor array substrate of claim 7, wherein the first and second banks are disposed in the same layer.

13. The organic thin film transistor array substrate of claim 12, wherein heights of the first and second banks range from 1 to 5 micrometers.

14. A display device comprising an organic thin film transistor array substrate which comprises a transparent substrate and organic thin film transistors formed on the transparent substrate, the organic thin film transistor comprising:

source and drain electrodes formed on the transparent substrate;

an active layer formed on the transparent substrate by an organic semiconductor material and disposed between the source and drain electrodes;

a gate insulating layer formed on the active layer;

a gate electrode formed on the gate insulating layer;

first and second banks disposed on the transparent substrate, inner sides of the first and second banks being covered by the source and drain electrodes, respectively, and wherein the active layer is in contact with the transparent substrate, and wherein the first and second banks are formed of a dielectric material, and none of the active layer, the gate insulating layer, and the gate electrode overlaps the first and second banks.

15. The display device of claim 14, wherein the source and drain electrodes completely cover the first and second banks, respectively.

16. The display device of claim 14, wherein the organic thin film transistor array substrate further comprising:

a passivation layer covering the organic thin film transistor with a via hole formed therein; and a pixel electrode electrically connected to the drain electrode through the via hole.

17. The display device of claim 14, wherein the first and second banks are formed of light-curable resin or thermal-curable resin.

18. The display device of claim 14, wherein the gate electrode and the gate insulating layer have shapes consistent with each other.

19. The display device of claim 14, wherein the first and second banks are disposed in the same layer.

20. The display device of claim 19, wherein heights of the first and second banks range from 1 to 5 micrometers.

* * * * *